United States Patent [19]
Janesch et al.

[11] Patent Number: 6,072,842
[45] Date of Patent: Jun. 6, 2000

[54] CARRIER-RECOVERY LOOP WITH STORED INITIALIZATION IN A RADIO RECEIVER

[75] Inventors: Stephen T. Janesch; Paul G. Schnizlein, both of Austin; Ed Bell, Round Rock, all of Tex.

[73] Assignee: DSP Group, Inc., Santa Clara, Calif.

[21] Appl. No.: 08/968,029

[22] Filed: Nov. 12, 1997

Related U.S. Application Data

[60] Provisional application No. 60/031,350, Nov. 21, 1996.

[51] Int. Cl.$^7$ .................................................. H03D 3/24
[52] U.S. Cl. .............................................................. 375/326
[58] Field of Search ................................... 375/326, 327, 375/371, 372, 373, 376; 329/306–309

[56] References Cited

U.S. PATENT DOCUMENTS

| | | | |
|---|---|---|---|
| 4,243,941 | 1/1981 | Zdunek | 329/309 |
| 4,866,395 | 9/1989 | Hostetter | 329/309 |
| 5,479,457 | 12/1995 | Waters | 375/375 |
| 5,572,553 | 11/1996 | Kimiavi et al. | 375/326 |

FOREIGN PATENT DOCUMENTS

| | | |
|---|---|---|
| 0 590 323 A1 | 4/1994 | European Pat. Off. . |
| 0 664 616 A2 | 7/1995 | European Pat. Off. . |
| 2 286 300 | 8/1995 | United Kingdom . |
| WO 96/12361 | 4/1996 | WIPO . |
| 98/23036 | 5/1998 | WIPO . |

OTHER PUBLICATIONS

XP002062128 Serizawa, "An Adaptive Carrier Tracking Loop For Digital Satellite Mobile Communications," IEEE Conference on Communications, vol. 3, Jun. 7–10, 1987, Seattle, Washington, pp. 1754–1760.

XP000269407 Uchishima, et al, "Burst DSP Demodulator For Low EB/No Operation,", Communications—Rising to the Heights, Denver, Jun. 23–26, 1991, vol. 1, Institute of Electrical and Electronics Engineers, pp. 226–230.

XP000358888 Hansen, et al, "VLSI Digital PSK Demodulator for Space Communication," European Transactions on Telecommunications and Related Technologies, vol. 4, Jan. 1993, pp. 43–52.

Sklar, B., "*Digital Communications; Fundamentals and Applications,*" PTR Prentice Hall, Englewood Cliffs, New Jersey, 1988, pp. 552.

Gardner, F., "*Phaselock Techniques,*" Second Edition, John Wiley & Sons, New York, 1979, pp. 165, 175 and 194.

*Primary Examiner*—Tesfaldet Bocure
*Attorney, Agent, or Firm*—Conley, Rose & Tayon P.C.; Jeffrey C. Hood; Cyrus F. Bharucha

[57] ABSTRACT

A carrier-recovery loop for a receiver in a communication system with features that facilitate initialization of the loop. The carrier-recovery loop is a PLL that uses a feedback signal to keep a recovery oscillator phase-locked to the carrier of a received signal. In the present invention, an initializing value of the feedback signal is stored in a memory and provided to a digitally controlled recovery oscillator (DCO). This initializing value brings the recovered signal to an initial frequency that approximates the carrier frequency. When the receivers starts to acquire a phase-lock with the carrier, the carrier-recovery loop is in a condition close to the desired phase lock. Preparing the DCO in this manner imparts a significant improvement to the carrier-recovery loop. The response time for the loop to acquire a phase lock depends in part on its initial frequency offset from the carrier. In general, reducing this initial offset reduces the loop's acquisition time. By thus anticipating the frequency of the carrier, this carrier-recovery loop can have an improved acquisition time to reach phase lock. The initializing value of the feedback signal can be generated by recording a sample of the feedback signal when the carrier-recovery loop is phase-locked to a received signal or to an on-board crystal oscillator. The invention also includes a mechanism to correct drifts in the crystal oscillator's frequency.

24 Claims, 9 Drawing Sheets

CARRIER-RECOVERY LOOP WITH STORED INITIALIZATION IN A RADIO RECEIVER

This application claims the benefit of priority of U.S. Provisional application Ser. No. 60/031,350, titled "Spread Spectrum Cordless Telephone System and Method" and filed Nov. 21, 1996, whose inventors were Alan Hendrickson, Paul Schnizlein, Stephen T. Janesch, and Ed Bell.

BACKGROUND OF THE INVENTION

1. Field of the Invention

The invention relates to electronic communication and, more particularly, to the carrier-recovery loop of a radio receiver.

2. Description of the Related Art

Radio communication is generally accomplished through a carrier wave that is modulated to bear information from a transmitting unit to a receiving unit. The transmission of the information involves modulating the carrier wave with a baseband signal that represents the information to be transmitted. Typically, the carrier wave is generated by an oscillator in the transmitter and modulated by a modulator to produce the transmitted signal. After traversing a communication channel, this signal is received by the receiver that demodulates it to extract the baseband signal.

An important component of the receiver is a recovery oscillator used in demodulating the received signal. The recovery oscillator generates a recovered signal, at a recovered frequency, that is used to demodulate the received signal. In communications systems that use digital modulation techniques such as differential phase-shift keying, the recovered frequency must be close to the frequency of the carrier wave: if these two frequencies are not matched, the receiver cannot efficiently demodulate the transmitted signal.

The receiver's recovery oscillator can be designed so that its natural frequency is close to that of the transmitter oscillator, but due to variations in manufacturing and differences in operating environments there will be frequency differences between the two oscillators. To compensate for the resulting offsets in frequency between the carrier wave and the receiver's recovery oscillator, the recovery oscillator can be locked to the carrier wave by incorporating it into phase-locked loop (PLL). Such a PLL serves as a carrier-recovery loop that ties the frequency of the recovery oscillator to the frequency of the carrier wave.

In addition to the recovery oscillator, the carrier-recovery loop includes a phase detector and a loop filter. The phase detector generates an error signal that represents the difference in phase between the recovery oscillator and the carrier wave. Since the original carrier wave is not typically available to the receiver unit, the phase detector must be able to extract the frequency of the carrier wave from the received signal. That is, it must be able to ignore variations in the received signal's phase that are due to the information encoded onto the carrier. For example, in the case of digital communication systems that use quadriphase-shift-keying (QPSK) modulation, information is encoded on the carrier by changing its phase by multiples of 90°. In these systems, the recovery loop's phase detector must not interpret these deliberate phase shifts of the carrier as erroneous frequency drifts in the carrier. Depending on the type of modulation, there are several established methods of making the phase detector in the carrier-recovery loop insensitive to information-bearing phase shifts on the carrier wave, while keeping its sensitivity to frequency drifts in the carrier.

The loop filter in the carrier-recovery loop receives the error signal from the phase detector. The error signal is conditioned (typically by low-pass filtering) in the loop filter to generate a feedback signal, which is then fed back to the recovery oscillator to keep its frequency matched to the frequency of the carrier wave.

The desired condition of the PLL, in which the recovery oscillator matches the frequency of the carrier wave, is a phase lock. Under this condition the carrier-recovery loop holds the phase of the recovered signal at a constant offset from the phase of the carrier wave, thereby matching the carrier's frequency. There is an inherent delay from the time that the received signal is provided to the carrier-recovery loop to the time that the carrier-recovery loop acquires a phase lock. This delay is the loop's acquisition time, which depends on the initial difference in frequency between the carrier wave and the recovery oscillator, on the response characteristics of the carrier-recovery loop, on the stability of the carrier wave, and on the presence of noise and interference in the received signal. During this acquisition time, the receiver cannot efficiently demodulate the received signal. Hence it is desirable to have a carrier-recovery loop with a reduced acquisition time.

SUMMARY OF THE INVENTION

The present invention comprises a carrier-recovery loop with novel features that allow initialization of a recovery oscillator at a frequency close to an anticipated lock point. The recovery oscillator in the loop is a digitally-controlled oscillator (DCO). The DCO receives a digital feedback signal from the loop filter and generates the recovered signal at the recovered frequency indicated by the digital feedback signal. The digital input to the oscillator facilitates initialization of the carrier-recovery loop: to start the DCO at an initial frequency, the receiver has only to provide a corresponding initializing value to the DCO. The initializing value of the feedback signal can be stored in a memory and provided to the DCO through a multiplexer. This initializing value is chosen so that it brings the recovered signal to an initial frequency that approximates the carrier frequency. When the multiplexer then switches to provide the feedback signal to the DCO, the carrier-recovery loop is in a condition close to the desired phase lock.

Preparing the DCO in this manner imparts a significant improvement to the carrier-recovery loop. The loop's acquisition time (from when it starts receiving the received signal to when it acquires a phase lock) depends on the initial difference in frequency between the carrier wave and the DCO's recovered signal, on the response characteristics of the carrier-recovery loop, on the stability of the carrier wave, and on the presence of noise and interference in the received signal. In general, reducing the initial frequency offset between the DCO's recovered signal and the carrier wave will reduce the loop's acquisition time. By thus anticipating the frequency of the carrier wave and providing the appropriate initializing value to the DCO, this carrier-recovery loop can have a reduced acquisition time for reaching a phase lock.

The initializing value of the feedback signal can be generated by recording a sample of the feedback signal when the carrier-recovery loop is phase-locked to a received signal. Alternatively, the sample can be stored when the carrier-recovery loop is phase-locked to an on-board crystal oscillator. This crystal oscillator can then be adjusted to correct drifts in its frequency over time.

In addition to decreasing the time for the carrier-recovery loop to acquire a phase lock with the carrier wave, the invention offers an improvement in the product lifetime. Since the receiver's crystal oscillator can be readjusted at time intervals over which its frequency may drift (months or years), it is less susceptible to having a crystal oscillator become unusable from such a drift. A third advantage is that the receiver's cost may be reduced, since crystals with a looser tolerance for center frequency and drift may be used.

BRIEF DESCRIPTION OF THE DRAWINGS

Other objects and advantages of the invention will become apparent upon reading the following detailed description and upon reference to the accompanying drawings in which.

DESCRIPTION OF THE PREFERRED EMBODIMENTS

The following patents and patent applications are hereby incorporated by reference in their entirety as though fully and completely set forth herein:

U.S. Provisional application Ser. No. 60/031,350, titled "Spread Spectrum Cordless Telephone System and Method" and filed Nov. 21, 1996, whose inventors are Alan Hendrickson, Paul Schnizlein, Stephen T. Janesch, and Ed Bell;

U.S. application Ser. No. 08/975,142, and filed Nov. 20, 1997, whose inventors are Alan Hendrickson and Paul Schnizlein;

U.S. application Ser. No. 08/968,202, titled "An Improved Phase Detector for Carrier Recovery in a DQPSK Receiver" and filed Nov. 12, 1997, whose inventors are Stephen T. Janesch, Alan Hendrickson, and Paul Schnizlein;

U.S. application Ser. No. 09/078,225, titled "Symbol-Quality Evaluation in a Digital Communications Receiver" and filed May 13, 1998, whose inventor is Alan Hendrickson;

U.S. application Ser. No. 08/968,028, titled "A Programmable Loop Filter for Carrier Recovery in a Radio Receiver" and filed Nov. 12, 1997, whose inventors are Stephen T. Janesch and Paul Schnizlein; and U.S. application Ser. No. 09/078,145, titled "A Method for Compensating Filtering Delays in a Spread-Spectrum Receiver" and filed May 13, 1998, whose inventor is Alan Hendrickson.

Figure 1:
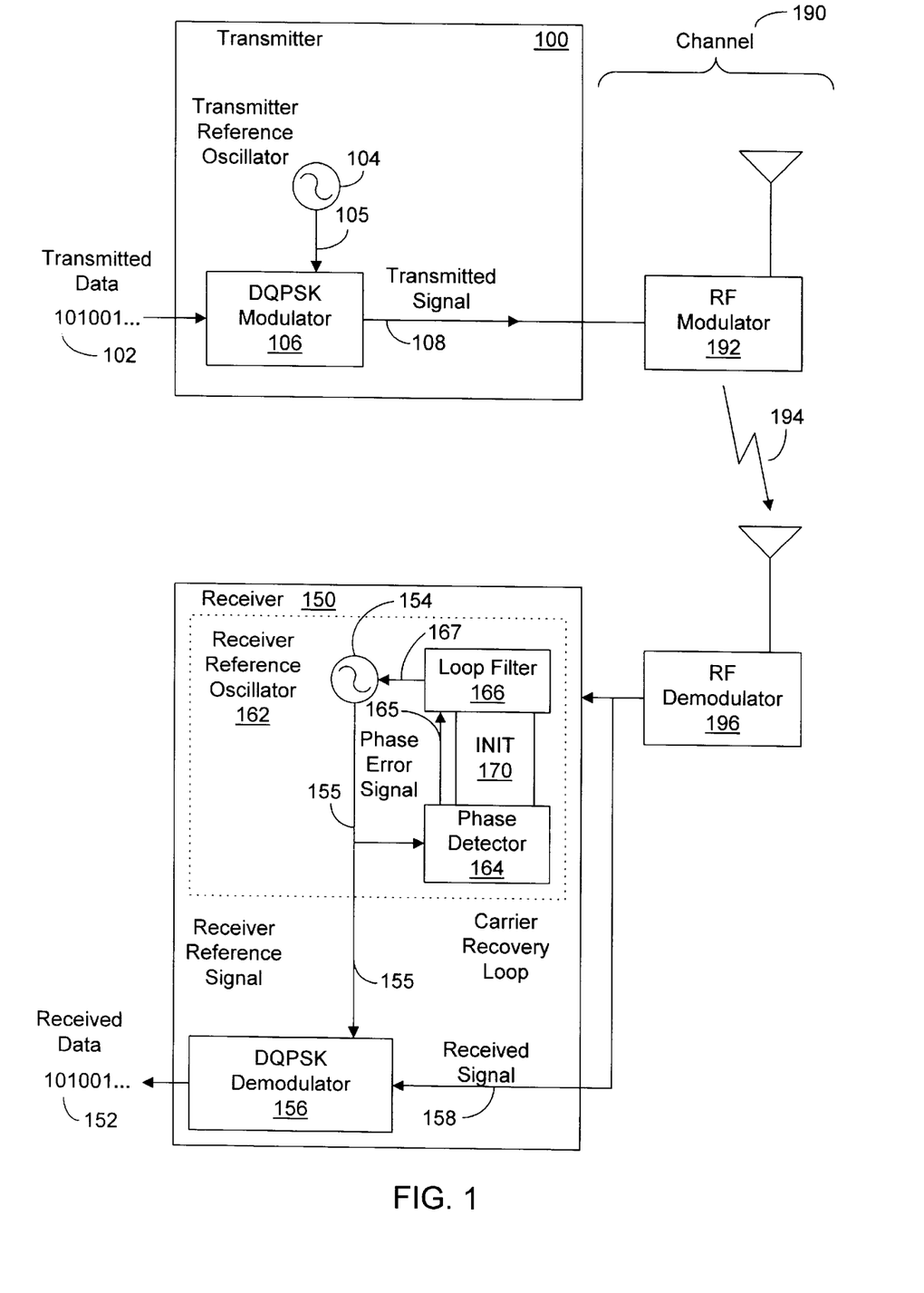
FIG. 1 is a schematic view of a telecommunication system.

FIG. 1

Digital Communication System

The present invention is comprised in a digital communication system as shown in FIG. 1. The communication system comprises at least one transmitter 100 and one receiver 150 for the communication of data. Receiver 150 may comprise a tine-division duplexing unit 150 which includes carrier recovery loop 162. The time-division duplexing communication unit alternates between receiving data and transmitting data. The system described in this figure uses differential quadriphase-shift keying (DQPSK) to convey data from a transmitter to a receiver. Although not depicted here, other modulation schemes such as ASK, FSK, and other variants of PSK could also be used to convey the data.

In the transmitter 100, digital data 102 are provided to a modulator 106. A transmitter reference oscillator 104 generates a sinusoidal carrier wave 105 for the modulator 106. The digital data 102 are encoded onto the carrier wave 105 by the modulator 106, which shifts the carrier's phase by multiples of 90° according to the technique of DQPSK modulation, a technique well-known in the art. In this technique, the modulator 106 shifts the phase of the carrier wave by multiples of 90° to generate a transmitted signal 108; these phase shifts are the symbols that encode the data. Each symbol lasts for a duration of time T after which the next phase shift is introduced to the carrier. The differences in phase angle between successive symbols represent the transmitted data 102. Since there are four possible symbols (shifts of 0°, 90°, 180°, or 270°) in QPSK modulation, each symbol represents two bits of the transmitted data.

The carrier wave's frequency is determined by the reference oscillator 104 in the transmitter. The transmitted signal 108 is the sinusoidal carrier wave with the data-bearing phase shifts of duration T. The transmitted signal 108 is sent via a physical communication channel 190 to the receiver 150.

The channel depicted in this figure is a radio transmission system that modulates the transmitted signal onto a radio wave 194 with a frequency greater than the carrier wave frequency. The channel 190 depicted here comprises the radio-frequency (RF) modulator 192, the radio wave 194 transmitted through the air, and the RF demodulator 196. As would be known to one skilled in the art, other communications channels such as transmission line, waveguide, or optical fiber systems can of course be used instead of (or in conjunction with) the depicted radio transmission system. Under ideal conditions the received signal 158 would be an exact replica of the transmitted signal 108. In practice, however, there may be some differences between these two signals due to degradation suffered in the communication channel.

In the receiver 150, the received signal is demodulated by a demodulator 156 to extract the received data 152. Ideally, the received data 152 would replicate the transmitted data 102, but in practice the two sets of data may differ due to encoding errors in the transmitter, decoding errors in the receiver, or degradation of the transmitted signal in the communications channel.

Figure 2:
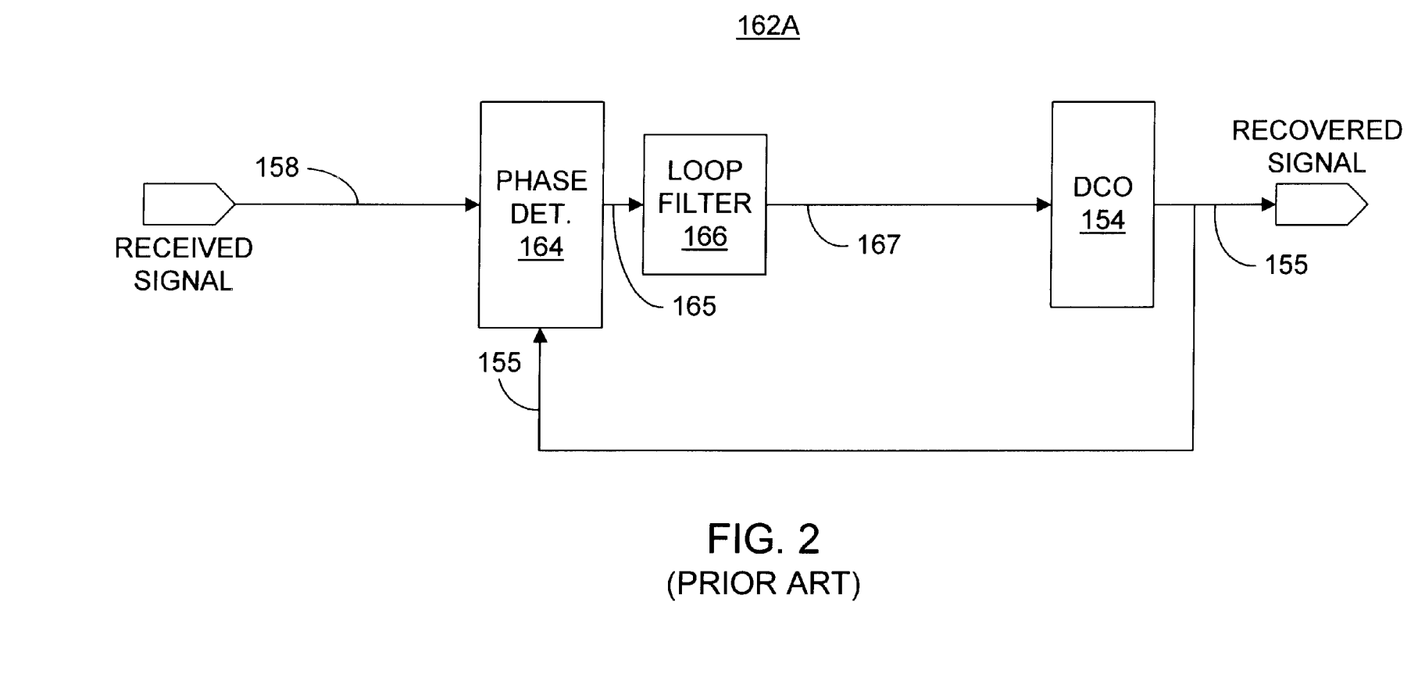
FIG. 2 illustrates a basic carrier-recovery loop.

FIGS. 1 and 2

Carrier Recovery

To extract the data from the received signal 158, the demodulator 156 uses a reference signal 155 that closely reproduces the carrier wave 105. Since the original carrier wave 105 is not usually available in the receiver unit, this reference is generated by a recovery oscillator 154 in the receiver. The recovery oscillator 154 generates a recovered signal 155 with a recovered frequency. This recovered frequency substantially matches the frequency of the transmitter reference oscillator 104 that generated the carrier wave 105; if the frequencies of the two oscillators are not matched, the receiver unit 150 cannot efficiently demodulate the transmitted signal. The recovery oscillator 154 is built so that its natural frequency is close to that of the transmitter reference oscillator 104. However, due to variations in manufacturing and differences in operating environments there will be drifts between the two oscillators.

To compensate for the resulting offsets in frequency between the carrier wave and the recovery oscillator, the recovery oscillator can be locked to the carrier wave by incorporating it into a phase-locked loop (PLL). This PLL is a carrier-recovery loop 162 that ties the frequency of the recovery oscillator 154 to the frequency of the transmitter reference oscillator 104. The feedback from the carrier-recovery loop 162 corrects offsets between the frequencies of the recovery oscillator 154 and the carrier, thereby recovering the frequency of the carrier wave 105 in the recovered signal 155.

The receiver shown in FIG. 1 includes a block diagram of a carrier-recovery loop 162. The carrier-recovery loop 162 includes the basic elements of a PLL: the recovery oscillator 154, a phase detector 164, and a loop filter 166. In addition, it contains the initialization system 170 with novel features for initializing the carrier-recovery loop.

FIG. 2 is a more detailed diagram of a carrier-recovery loop 162A without the initialization system of the present invention. This carrier-recovery loop 162A uses digital components and digital feedback. The phase detector 164 receives the received signal 158 and the recovered signal 155. With these two inputs, the phase detector 164 compares the recovered signal's phase to the phase of the carrier wave and generates a digital phase-error signal 165 indicative of the phase shift between them. The phase-error signal 165 is then provided to the loop filter 166. The loop filter 166 uses digital processing elements to condition the phase-error signal 165 to generate a digital feedback signal 167; this feedback signal is fed back to a digitally controlled recovery oscillator (DCO) 154 to nullify its offset from the carrier frequency. It is the DCO 154 that generates the recovered signal 155; when the loop has acquired a phase lock this signal 155 has a recovered frequency that matches the frequency of the carrier wave 105.

Digitally Controlled Oscillator

There are several types of DCO's that can be used in the carrier-recovery loop. The various designs can be grouped into two categories, and the distinction between these categories has some consequences for the design and use of the loop. In the various embodiments described below, the DCO can be either (1) a part-analog device comprising a digital-to-analog (D/A) converter and a voltage-controlled oscillator (VCO) or (2) an all-digital device that generates an output clock signal based on an input word and a timing reference generated by a master clock.

In the part-analog DCO, a D/A converter receives the digital feedback signal 167, and generates an analog signal at a voltage corresponding to the input digital word. This analog signal is provided to the input of a VCO, which generates an oscillatory voltage output signal. The VCO output oscillates at a VCO frequency, which depends monotonically on the analog signal applied to the VCO input; changing the level of the analog signal changes the VCO frequency. Thus the D/A converter and the VCO together make a digitally-controlled oscillator (DCO), and the output generated by the VCO is the recovered signal 155.

Two of the parameters that characterize the VCO are its center frequency—the output frequency it generates when a zero-volt analog signal is applied to its input, and its gain—the rate of change in it output frequency with respect to the change in the applied input voltage. In general, these parameter will vary from one VCO to another, even when the VCOs are produced by the same process. Typically, a VCO comprises a tunable capacitive element such as a varactor, whose physical dimensions and electrical characteristics determine the center frequency and gain. Variations in the manufacturing process lead to some spread in these dimensions and characteristics, and therefore to variations in the center frequency and gain. Also, these two VCO parameters are generally temperature-dependent. As a consequence, for several different VCOs to produce output signals at the same frequency, they must generally be provided with different input signals. And as the temperature changes, the input signal to a given VCO must be adjusted if its output frequency is to be kept constant. Thus, if a carrier-recovery loop 162 or 162A has a part-analog DCO, then the values used in its feedback signal 167 depend not only on the frequency of the recovered signal 155, but on the particular DCO 154 incorporated in the loop, and perhaps on environmental conditions as well. Nonetheless, the part-analog DCO makes a robust recovery oscillator 154 in the carrier recovery loop 162.

The all-digital DCO, as would be known to one skilled in the art, can be made according to a variety of designs for direct digital synthesizers. In this category of DCO's, the digital feedback signal 167 is typically provided to a digital integrator that serves as a phase accumulator. A calibrated and stable master clock provides an absolute frequency reference to the DCO. This design of DCO is not susceptible to the environmental and manufacturing variations that affect the part-analog DCO. Rather, its accuracy is determined by the stability of the master clock, which is typically good to within a few parts-per-million, and its precision is determined by the number of bits used in the input 167 and in the DCO's internal registers. Also, the all-digital DCO is typically not susceptible to analog noise.

The primary difference between a carrier-recovery loop 162 or 162A using a part-analog DCO and one using an all-digital DCO is that with the part-analog DCO, the digital feedback signal 167 indicates a frequency offset from the VCO's center frequency. This is a signal that, strictly speaking, has meaning only with respect to the VCO in the part-analog DCO. With an all-digital DCO, however, the digital feedback signal 167 indicates an absolute frequency, to within the tolerances of the master clock.

Figure 3:
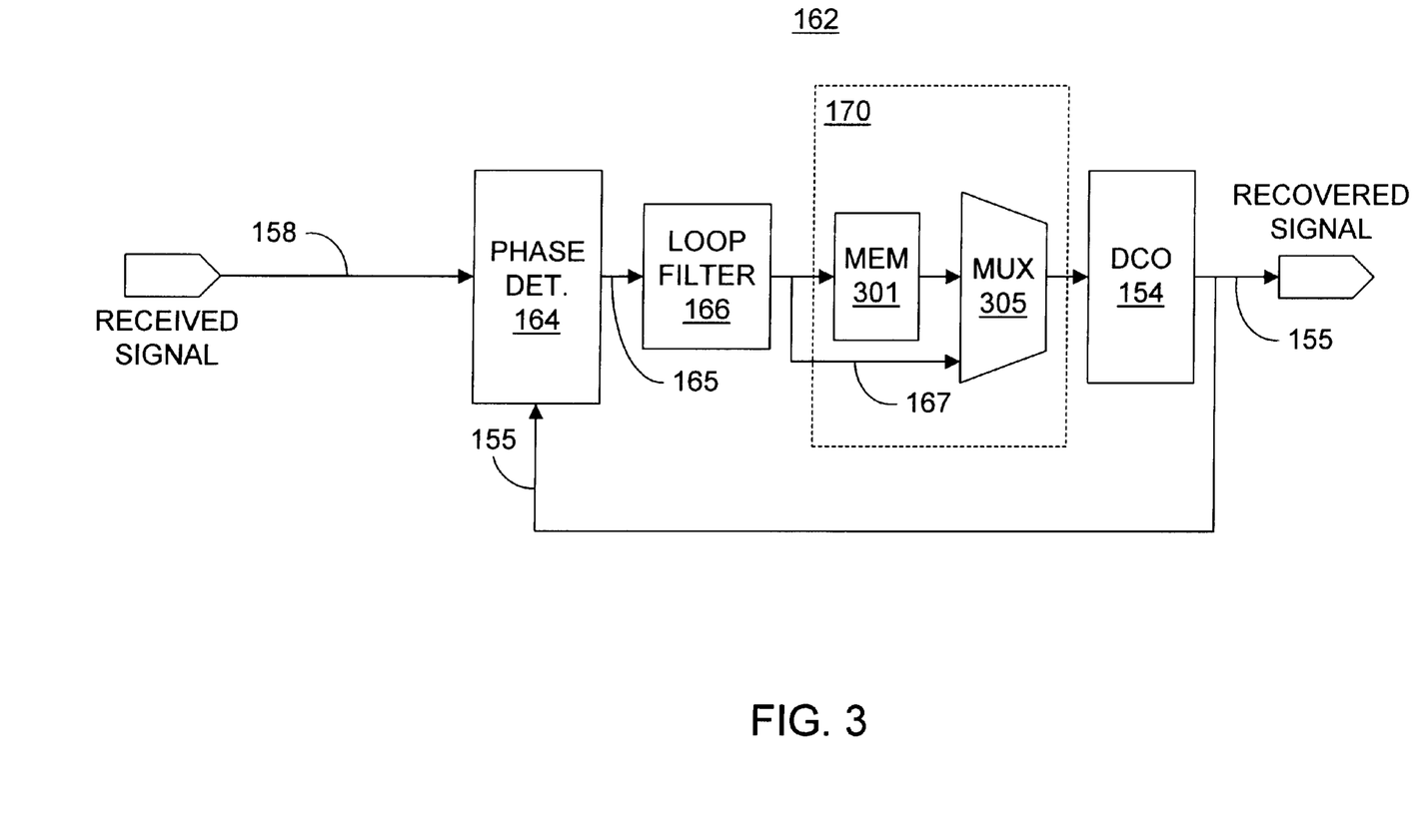
FIG. 3 illustrates one embodiment of the carrier-recovery loop.
Figure 4:
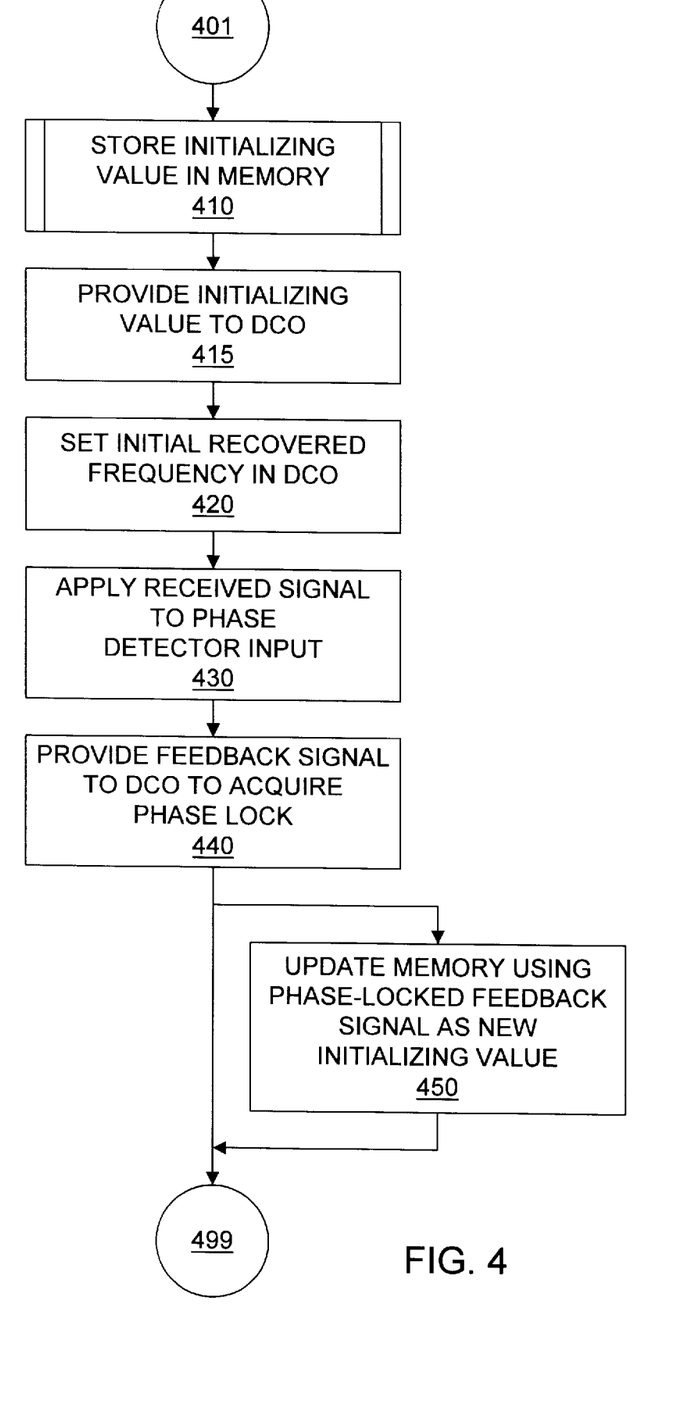
FIG. 4 is a flowchart for storing and using an initializing value in the memory of the carrier-recovery loop.

FIGS. 3 and 4

Initialization of the Carrier-Recovery Loop

FIG. 3 illustrates a novel carrier-recovery loop 162 according to an embodiment of the present invention. For clarity, label numbers in this and the following figures are the same as the label numbers in previous figures for components and signals described earlier. The carrier-recovery loop shown here includes similar elements and connectivity as the loop in FIG. 2, but the carrier-recovery loop of the present invention also includes additional elements in the initialization system 170 that expand the functions of the previously described carrier-recovery loop.

In FIG. 3 the phase detector 164, the loop filter 166, and the DCO 154 have similar operations as were described for the carrier-recovery loop in FIG. 2. The carrier-recovery loop 162 also includes an added memory 301 that allows the modified system to store initial values of the feedback signal. This memory 301 is connected to the input of the DCO 154 via a multiplexer 305. As shown, the multiplexer 305 has a first input that receives the output of the memory 301, and a second input that receives the digital feedback signal 167 from the loop filter 166. The memory 301 receives and stores an initializing value of the digital feedback signal 167, which the multiplexer 305 selectively provides to the DCO 154. This initialization value represents the predicted frequency of the carrier wave. As discussed earlier, this initialization value may indicate either an absolute frequency or an offset from a VCO center frequency, depending on whether the DCO 154 has an all-digital or a part-analog design. Providing this initializing value causes the DCO 154 to generate the recovered signal at an initial frequency corresponding to the initializing value. By preparing the memory 301 with an appropriate initializing value, the receiver 150 causes the initial frequency of the recovered signal 155 to closely approximate the frequency of the carrier wave. The multiplexer 305 can then switch to provide the digital feedback signal 167 to the DCO 154, thereby enabling the DCO 154 to acquire a phase lock. With its initial recovered frequency close to that of the carrier wave, the carrier-recovery loop acquires a phase lock in a reduced time.

The flowchart in FIG. 4 summarizes the operation of the system in FIG. 3. After a starting point 401 before it recovers the carrier signal, in step 410 the carrier-recovery loop 162 stores a preliminary initializing value in the memory 301. The next step 415 in initializing the carrier-recovery loop entails the multiplexer 305 switching to provide this value from the memory 301 to the DCO 154. The DCO then changes its recovered frequency in step 420 according to the initializing value. These three steps 410, 415, 420 initialize the carrier-recovery loop so that when the received signal 158 is provided to the phase detector 164 in the next step 430, the loop can more rapidly acquire a phase lock with it. In step 440 the multiplexer 305 switches to provide the digital feedback signal 167 to the DCO, thereby enabling the loop to acquire a phase lock. Before the initialization procedure terminates 499, it may perform an optional step 450 of updating the initialization value by storing the digital feedback signal 167 in memory 301.

This procedure can be used in a time-division duplex (TDD) or a time-division multiple access (TDMA) communication system, in which a transceiver alternates between transmitting and receiving data. The initialization procedure can be executed prior to the transceiver receiving data, thereby reducing the signal acquisition time between transmission and reception.

The optional step 450 of updating the initialization value can be especially useful if the DCO experiences a drift in its frequency over a period of time. Such drifts can be expected in a mobile transceiver, such as a cordless or cellular telephone, which may be routinely exposed to changing ambient temperatures. At intervals of time over which the DCO may experience such drifts, a new initialization value can be recorded that better predicts the offset between the DCO's frequency and the frequency of the carrier wave.

Figure 5:
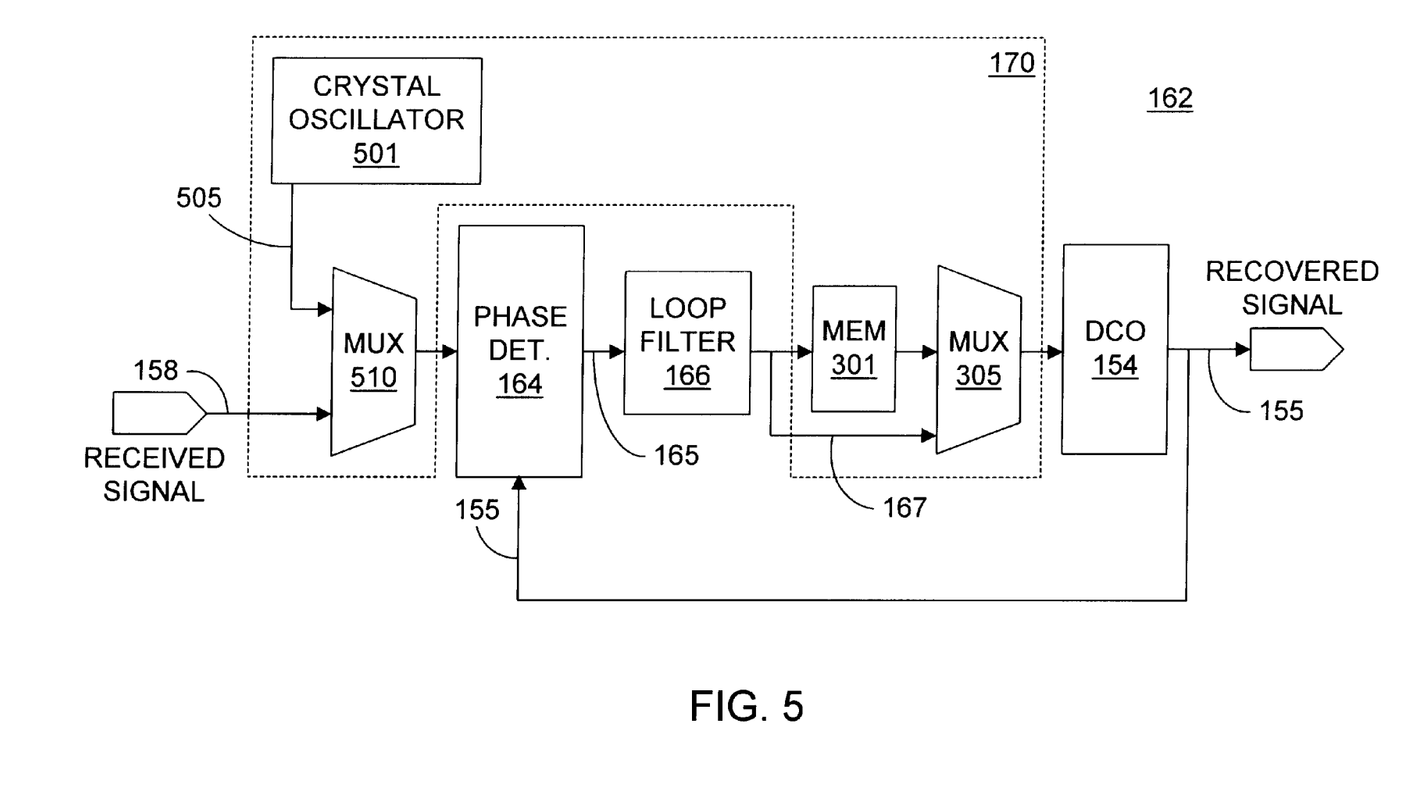
FIG. 5 illustrates an embodiment of the carrier-recovery loop with a crystal oscillator reference.
Figure 6:
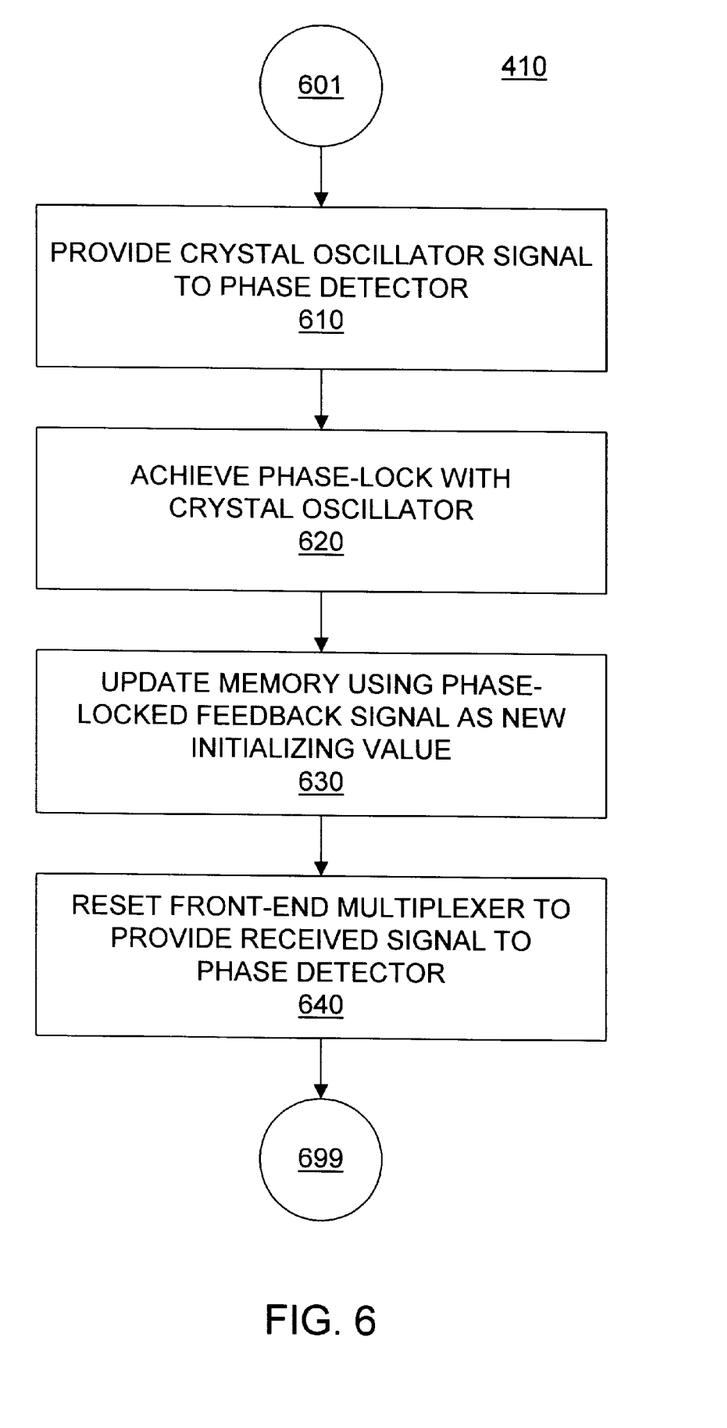
FIG. 6 is a flowchart for using the crystal oscillator.

FIGS. 5 and 6
Initialization with a Crystal Oscillator

FIG. 5 shows an embodiment of the invention with a further enhancement that allows the initializing value to be set when a received signal is not available to the receiver. In this embodiment a crystal oscillator 501, also more generally referred to as a stable reference oscillator, and a front-end multiplexer 510 are added to the carrier-recovery loop presented in FIG. 3. The crystal oscillator 501 provides a stable reference signal 505 at a stable reference frequency. (Other stable reference oscillators can of course be substituted for the crystal oscillator; possible alternatives include other oscillators, atomic clocks, and timing reference signals such as a GPS signal.) The reference signal 505 can be provided to the phase detector 164 through the front-end multiplexer 510. With the reference signal provided to the phase detector 164, the carrier-recovery loop can acquire a phase lock and store an initializing value in the memory 301 that represents the stable reference frequency of the crystal oscillator 501. This stable reference frequency is chosen to be near the center of the expected range of carrier frequencies for the received signal. The stable reference signal 505 thus provides an alternative to the received signal for preparing an initializing value. The stable reference 505 is especially useful in mobile communications systems (such as cordless and cellular hand units), which receive signals from stable base stations, but which themselves suffer variations in operating environments that affect their PLL oscillators.

FIG. 6 is a flowchart describing the steps in setting the initializing value using the crystal oscillator 501. The start 601 occurs prior to a period of reception, at intervals over which the DCO may suffer a significant frequency drift. In the first step 610, the front-end multiplexer 510 switches to provide the crystal oscillator's stable reference signal 505 to the phase detector 164. In step 620 the recovery loop acquires a phase-lock with the stable reference signal 505, and in step 630 the resulting digital feedback signal is sampled and stored in the memory 301. If the DCO 154 is a part-analog device with D/A converter and a VCO as discussed earlier, then the value stored in memory represents the frequency offset between the crystal oscillator 501 and the VCO center frequency. If, however, the DCO is an all-digital device, then the value stored in the memory 301 represents the absolute frequency of the crystal oscillator 501. In step 640 the front-end multiplexer 510 resets to again provide the received signal 158 to the phase detector 164. The termination 699 of this procedure leaves the receiver with a new initialization value for preparing the DCO 154 with the stable reference frequency of the crystal oscillator 501.

The stable reference can also be used to generate the preliminary initializing value required in step 410 of FIG. 4. In this case, the steps 610-640 of FIG. 6 provide the details of the first step 410 of FIG. 4.

Figure 7:
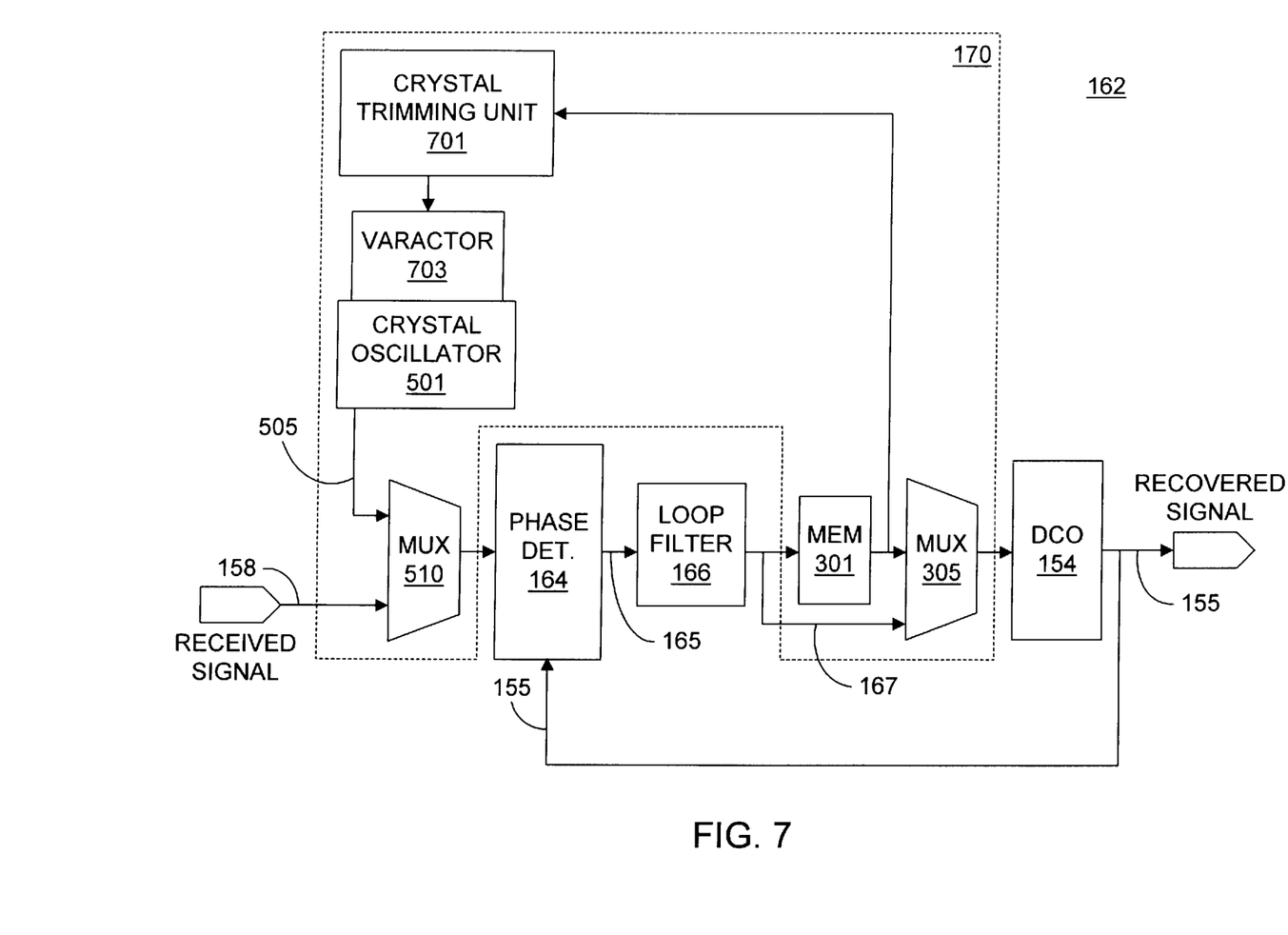
FIG. 7 illustrates an embodiment of the carrier-recovery loop with feedback to trim the crystal oscillator.
Figure 8:
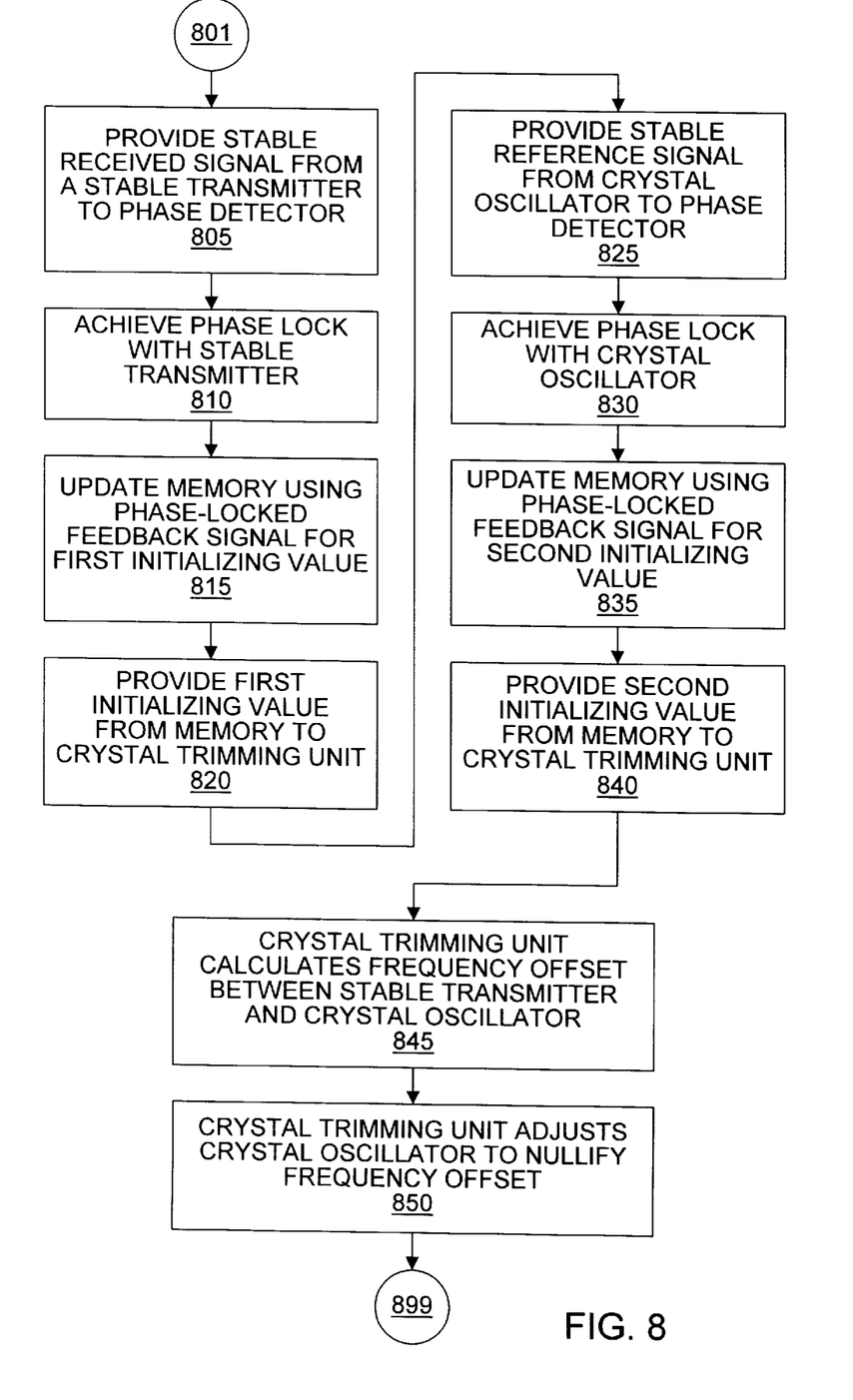
FIG. 8 is a flowchart for trimming the crystal oscillator.

FIGS. 7 and 8
Trimming the Crystal Oscillator
First Embodiment

FIG. 7 shows an embodiment of the invention with feedback to the crystal oscillator. The feedback is used to adjust, or trim, the crystal oscillator. In this embodiment, the frequency of the crystal oscillator is adjusted to match the frequency of the received carrier wave. It is desirable to minimize the frequency difference between the crystal oscillator and the received carrier, as the performance of the carrier-recovery loop, pseudo-random noise (PN) signal recovery (in spread-spectrum embodiments of the invention), symbol recovery and frame timing recovery are all adversely affected by large frequency differences.

In this embodiment of the invention, a crystal trimming unit 701 has been added to the carrier-recovery loop presented in FIG. 5. As shown in FIG. 7, the crystal trimming unit is coupled to the memory 301 and to the crystal oscillator 501. The unit 701 receives the initialization values stored in the memory 301 and uses them to adjust the crystal oscillator's stable reference frequency. One way to adjust, or trim, the reference frequency is to change the bias on a varactor diode 703 capacitively coupled to the crystal. By trimming the crystal oscillator 501, the trimming unit 701 can bring the crystal's stable reference frequency to match the frequency of the received signal. This adjustment can be a useful correction in mobile transceiver units, which, as discussed earlier, are typically exposed to varying operating conditions. If these conditions cause the crystal's stable reference frequency to slowly drift over time, and the received signal is generated by a stable remote transmitter (not shown), then occasionally trimming the receiver's crystal will help keep it at the constant frequency of the remote transmitter. (The remote transmitter could be, for example, the transmitter reference oscillator 104 with the transmitter 100 kept in a more protected environment so that its oscillator 104 is not subject to significant frequency drifts.)

The procedure for trimming the crystal oscillator 701 in FIG. 7 is shown in FIG. 8. The start 801 occurs prior to a period of reception, at intervals over which the crystal oscillator may suffer a significant frequency drift. Steps 805–815 are similar to steps 610–630 in FIG. 6. In steps 805–815, the receiver stores a first initializing value in the memory 301 when the carrier-recovery loop is phase-locked to the received signal. This initializing value represents the frequency of the received signal. To store this value, the receiver provides the received signal 158 to the DCO 154 in step 805, the carrier-recovery loop acquires a phase-lock with the received signal 158 in step 810, and the digital feedback signal 167 is then stored in memory 301 in step 815. In step 820 the trimming unit 701 receives the first initializing value from the memory 301.

Steps 825–835 are also similar to steps 610–630 in FIG. 6. In steps 825–835, the receiver stores a second initializing value in memory when the carrier-recovery loop is phase-locked to the crystal's stable reference signal 505. This initializing value represents the crystal's stable reference frequency. To store this value, the receiver provides the stable reference signal 505 to the DCO 154 in step 825, the carrier-compensation loop acquires a phase-lock with the stable reference signal 505 in step 830, and the digital feedback signal 167 is then stored in memory 301 in step 835. In step 840 the trimming unit 701 receives the second initializing value from the memory 301.

In step 845 the trimming unit 701 uses the first and second initializing values to calculate the frequency difference between the crystal's stable reference frequency and the frequency of the remote transmitter. Then, in step 850, the trimming unit adjusts the crystal oscillator 501 to nullify this frequency difference. The trimming procedure then comes to termination 899 with the crystal oscillator 501 matched in frequency to the received signal 158 that was generated by the remote transmitter.

FIG. 9
Trimming the Crystal Oscillator
Second Embodiment

In a second embodiment of the invention with crystal-oscillator trimming, the receiver 150 is incorporated in a TDD transceiver unit, and the crystal oscillator 501 is also used as a frequency reference to generate a carrier wave during the TDD transceiver's transmit periods. The communications link in this preferred embodiment is between two transceivers. One of these transceivers—the variable-side transceiver—has a crystal oscillator that is occasionally trimmed to keep it matched with the crystal oscillator in the other transceiver—the fixed-side transceiver.

It is desirable to minimize the difference between the two crystal oscillator frequencies, as the performance of the carrier-recovery loop, PN recovery (in spread-spectrum embodiments of the invention), symbol recovery, and frame timing recovery are all adversely affected by large differences in frequency. The carrier-recovery loops of each transceiver in this embodiment of the invention have the same block layout as was shown in FIG. 7. These loops have the same structure as discussed earlier, but in the variable-side transceiver, additional information about the remote (fixed-side) transceiver is provided to the crystal trimming unit 701 as described below.

Figure 9A:
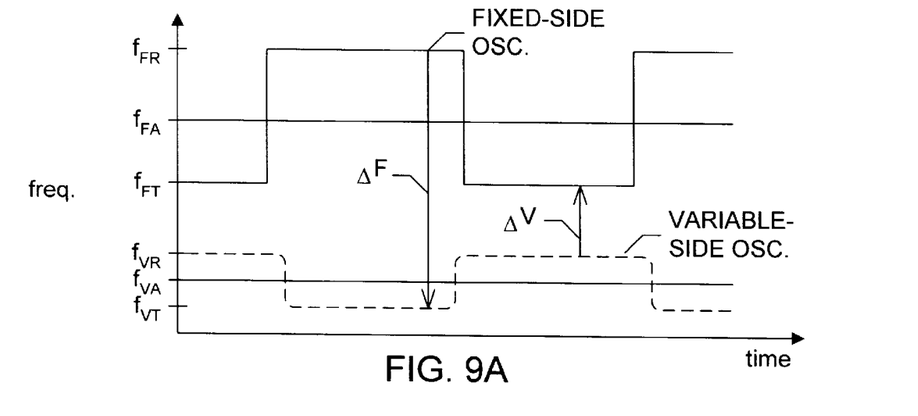
FIG. 9 graphs the transmit and receive oscillator frequencies to illustrate the trimming process.

FIG. 9 illustrates by example the frequencies of the crystal oscillators 501 of the fixed and variable sides of the link in TDD operation. This figure graphs the frequencies of the two oscillators versus time during one TDD frame. The first graph, FIG. 9A, shows the case where the crystal references 501 are uncompensated. Each frequency changes slightly from transmit to receive due to the switching on and off of the transmitter and receiver. The fixed-side oscillator changes from a transmit frequency $f_{FT}$ to a receive frequency $f_{FR}$ as its transceiver switches between transmission and reception. The average of these two frequencies is indicated by $f_{FA}$. Similarly, $f_{VT}$, $f_{VR}$, and $f_{VA}$ indicate the transmit, receive, and average frequencies of the variable-side oscillator. The two crystal oscillators have some difference between their average frequencies, as would be expected for two frequency synthesizers referenced to uncompensated crystal reference oscillators. In a preferred embodiment of the invention, the carrier-recovery loop of the variable-side transceiver adjusts its crystal oscillator 501 to reduce the offset in average frequencies $|f_{FA}-f_{VA}|$. The procedure for this adjustment depends on the type of DCO 154 used in the carrier-recovery loops.

In the first case, the DCO's in the carrier-recovery loops are of the part-analog type discussed earlier. Each DCO 154 has a D/A converter that converts the digital feedback signal 167 into an analog signal and provides it to a VCO, which generates the recovered signal 165. In order for the variable-side transceiver to trim its crystal oscillator 501 according to the preferred embodiment using part-analog DCO's, the transceivers on each side of the link must be able to do three things: each side must be able to acquire and store in memory a value representative of its own crystal oscillator frequency; each side must be able to acquire and store in memory a value representative of the received signal's carrier frequency; and each side must be able to calculate the offset (difference) between its crystal frequency and the received carrier frequency. In addition, the fixed side must be able to communicate this offset to the variable side. The variable side must be able to receive this offset, compare it to its own offset, and adjust its crystal oscillator to minimize the difference between these two offsets.

Consider the example frequencies in FIG. 9A. With the ability to calculate offset frequencies as described above, the carrier-recovery loop of the fixed side would indicate the offset ΔF of the received carrier as being negative, and the carrier-recovery loop of the variable side would indicate the offset ΔV of the received carrier as being positive. Also, the offset would be larger in the variable-to-fixed direction, making acquisition more difficult and resulting in degraded link quality in that direction.

Figure 9B:
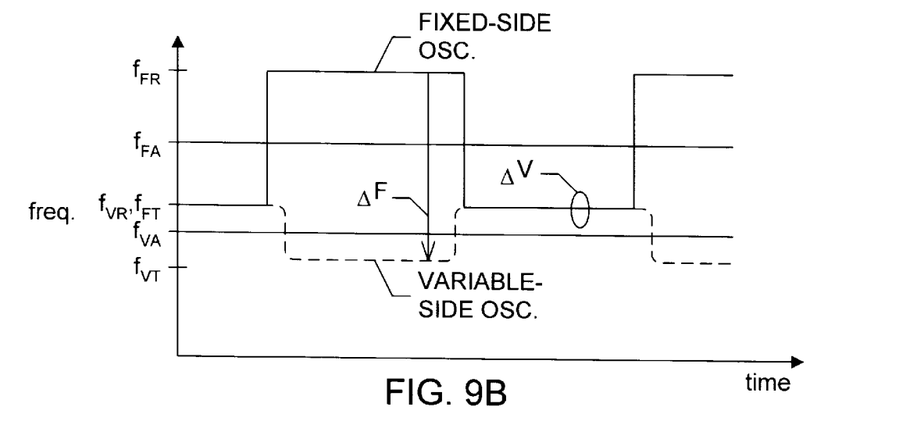

FIG. 9B illustrates the limited ability of the variable side of the link to compensate for the offset frequency if it has no knowledge of the offset frequency of the fixed side. (This was the case in the previous embodiment with crystal-oscillator trimming described earlier.) By adjusting its own crystal oscillator according to the frequency offset between its crystal and the received carrier, the variable-side transceiver can essentially drive its offset to zero, but the offset on the fixed side ΔF will persist and may still degrade link quality. As shown in FIG. 9B, this adjustment reduces the total offset between the two average frequencies from the case of FIG. 9A, but still does not minimize the total offset.

Figure 9C:
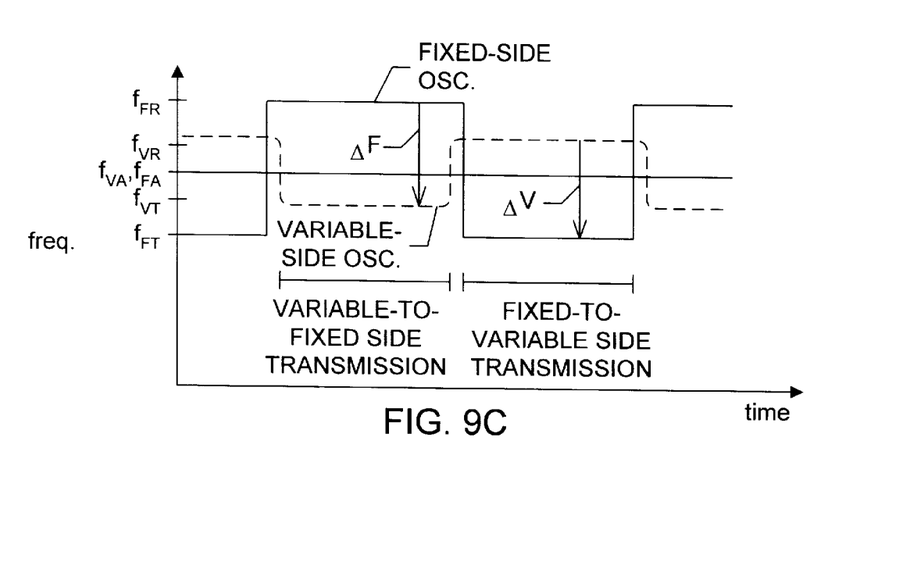

FIG. 9C illustrates the preferred embodiment, with the offset of the fixed side ΔF being communicated to and used by the variable side. This value is communicated through a data field in the TDD frames sent between the variable-side and fixed-side transceivers. Provided with this information, the variable side crystal trimming unit 701 drives its offset ΔV to equal ΔF. The difference between the average frequencies, thus the difference between the crystal frequencies, is minimized. Differences in PN timing, symbol timing and frame timing are also minimized.

In the second case of the preferred embodiment, the DCO's in the fixed and variable-side transceivers have the all-digital design described earlier. Since these DCO's receive as input digital feedback signals 167 that indicate absolute frequencies, the procedure for trimming the variable-side crystal oscillator can be simplified. In order for the variable-side transceiver to trim its crystal oscillator 501 according to the preferred embodiment using all-digital DCO's, the fixed-side transceiver only needs to (1) achieve a phase lock with the received carrier, (2) store a first value in the memory 301 indicating the frequency $f_{VT}$ of the received carrier, and (3) send this first value indicating the received carrier frequency (as measured by the fixed-side transceiver) to the variable-side transceiver. The fixed side transceiver does not need to calculate the offset between its crystal frequency and the received carrier frequency, since the first value is an absolute measure of the received carrier frequency.

The variable-side transceiver receives the first value indicating the variable-side transmit frequency $f_{VT}$ (as measured by the fixed-side transceiver). This first value is provided to the crystal trimming unit 701 in the variable-side transceiver. The crystal trimming unit 701 also receives a second value from the memory 301 in the local carrier-recovery loop 162 that indicates the fixed-side transmit frequency $f_{FT}$ (as measured by the variable-side transceiver). The crystal-trimming unit 701 in the variable-side transceiver then adjusts its crystal oscillator 501 in the variable-side transceiver until the first value it receives from the fixed-side transceiver is equal to the second value measured in the variable-side transceiver. The adjustment process is a closed-loop feedback process, and various algorithms can be used for choosing the incremental adjustments based on the first and second values. When the two values are equal, the average frequencies $f_{FA}$ and $f_{VA}$ will be closely matched, as shown in FIG. 9C.

It is to be understood that multiple variations, changes and modifications are possible in the aforementioned embodiments of the invention described herein. Although certain illustrative embodiments of the invention have been shown and described here, a wide range of modification, change, and substitution is contemplated in the foregoing disclosure and, in some instances, some features of the present invention may be employed without a corresponding use of the other features. Accordingly, it is appropriate that the foregoing description be construed broadly and understood as being given by way of illustration and example only, the spirit and scope of the invention being limited only by the appended claims.

We claim:

1. A method for initializing a carrier-recovery loop in a communications receiver, wherein said communications receiver receives a received signal with a received frequency, wherein said carrier-recovery loop comprises a digitally controlled oscillator (DCO), the method comprising:

storing an initializing value of a digital feedback signal in a memory;

providing said initializing value from said memory to said DCO, said DCO generating a preliminary recovered signal with a preliminary recovered frequency in response to said providing said initializing value to said DCO;

providing said digital feedback signal to said DCO;

said carrier-recovery loop acquiring a phase lock with said received signal in response to said providing said digital feedback signal to said DCO, wherein in said phase lock with said received signal said DCO generates a recovered signal with a recovered frequency;

wherein said recovered frequency approximates said received frequency, and wherein said preliminary recovered signal is useable in said communication receiver to reduce an acquisition time for said acquiring said phase lock with said received signal.

2. The method of claim 1, wherein said carrier recovery loop further comprises a phase detector and a loop filter, and wherein said acquiring said phase lock with said received signal comprises:

providing said received signal, said preliminary recovered signal, and said recovered signal to said phase detector;

said phase detector generating a digital phase-error signal and providing said digital phase-error signal to said loop filter, wherein said digital phase-error signal indicates a phase difference between said recovered signal and said received signal;

said loop filter generating said digital feedback signal in response to said phase-error signal;

said DCO adjusting a frequency of said DCO in response to said digital feedback signal.

3. The method of claim 1, wherein said storing said initializing value of said digital feedback signal in said memory comprises storing a sample of said digital feedback signal as said initializing value in said memory.

4. The method of claim 3, wherein said carrier-recovery loop is used in a time-division duplexing communications unit, wherein said communications unit alternates between receiving data and transmitting data, and wherein said providing said initializing value from said memory to said DCO and said acquiring said phase lock with said received signal occur prior to said receiving data.

5. The method of claim 3, wherein said carrier-recovery loop is used in a time-division multiple-access communications unit, wherein said communications unit alternates between receiving data and transmitting data, and wherein said providing said initializing value from said memory to said DCO and said acquiring said phase lock with said received signal occur prior to said receiving data.

6. The method of claim 3 wherein said storing said initializing value of said digital feedback signal in said memory comprises storing said sample of said digital feedback signal as said initializing value in said memory after said carrier-recovery loop has acquired a prior phase lock with said received signal.

7. The method of claim 1, wherein said carrier-recovery loop further comprises a stable reference oscillator that generates a stable reference signal at a stable reference frequency, and wherein said storing said initializing value in said memory comprises:

providing said stable reference signal to said phase detector;

said carrier-recovery loop achieving a phase lock with said stable reference signal; and said memory storing a sample of said digital feedback signal resulting from said phase lock with said stable reference signal as said initializing value;

wherein said initializing value represents said stable reference frequency of said stable reference oscillator.

8. The method of claim 7, wherein:

said received signal is generated by a remote transmitter at a remote transmitter frequency; and said stable reference oscillator is adjustable to compensate for slow frequency drifts;

the method further comprising:

storing a first initializing value when said carrier-recovery loop has acquired said phase lock with said received signal;

storing a second initializing value when said carrier-recovery loop has acquired said phase lock with said stable reference signal;

calculating a difference using said first initializing value and said second initializing value, wherein said difference represents a frequency offset between said stable reference frequency and said remote transmitter frequency; and adjusting said stable reference oscillator to nullify said frequency offset between said stable reference frequency and said remote transmitter frequency.

9. The method of claim 7, wherein:

said receiver is comprised in a local time-division duplexing (TDD) transceiver;

said received signal is generated by a remote transmitter in a remote TDD transceiver at a remote transmitter frequency; and said stable reference oscillator is adjustable to compensate for slow frequency drifts;

the method further comprising:

storing a first initializing value when said carrier-recovery loop has acquired said phase lock with said received signal;

storing a second initializing value when said carrier-recovery loop has acquired said phase lock with said stable reference signal;

calculating a local difference using said first initializing value and said second initializing value, wherein said local difference represents a local frequency offset between said stable reference frequency and said remote transmitter frequency; receiving a remote difference from said remote TDD transceiver, wherein said remote difference represents a remote frequency offset between a stable reference frequency in said remote transceiver and a local transmitter frequency of said local TDD transceiver; and adjusting said stable reference oscillator to match said local frequency offset with said remote frequency offset.

10. The method of claim 7, wherein:

said receiver is comprised in a local time-division duplexing (TDD) transceiver;

said received signal is generated by a remote transmitter in a remote TDD transceiver at a remote transmitter frequency; and said stable reference oscillator is adjustable to compensate for slow frequency drifts;

the method further comprising:

receiving a first value from a remote TDD transceiver, wherein said first value represents a local transmitter frequency of said local TDD transceiver with respect to a stable reference frequency in said remote transceiver;

storing a second value when said carrier-recovery loop has acquired said phase lock with said received signal, wherein said second value represents said remote transmitter frequency of said remote TDD transceiver with respect to said stable reference frequency of said stable reference oscillator; and adjusting said stable reference oscillator to match said first value with said second value.

11. The method of claim 8, or of claim 9, or of claim 10, wherein said adjusting said stable reference oscillator occurs after time periods over which said stable reference oscillator has significant frequency drifts.

12. The method of claim 8, or of claim 9, or of claim 10, wherein said stable reference oscillator comprises a piezo-electric crystal coupled to a varactor diode, and wherein said adjusting said stable reference oscillator comprises changing a bias on said varactor diode.

13. A carrier-recovery loop in a communications receiver that receives a received signal with a received frequency and generates a recovered signal with a recovered frequency, said carrier-recovery loop comprising:

a signal input that receives said received signal;

a phase detector that receives said received signal from said signal input and receives said recovered signal, wherein said phase detector generates a digital phase-error signal that indicates a phase difference between said received signal and said recovered signal;

a loop filter that receives said digital phase-error signal from said phase detector and generates a digital feedback signal in response to said digital phase-error signal;

a memory that stores an initializing value of said digital feedback signal;

a digitally controlled oscillator (DCO) coupled to said memory and coupled to said loop filter;

wherein:

during an initialization of said carrier-recovery loop, said DCO receives said initializing value from said memory, said DCO generates a preliminary recovered signal in response to said initializing value, and said DCO provides said preliminary recovered signal to said phase detector;

after said initialization said DCO receives said digital feedback signal from said loop filter, said DCO generates said recovered signal in response to said digital feedback signal, and said DCO provides said recovered signal to said phase detector; and said initialization of said carrier-recovery loop reduces an acquisition time for said carrier-recovery loop to acquire a phase lock with said received signal, wherein in said phase-lock said recovered frequency matches said received frequency.

14. The carrier-recovery loop of claim 13 further comprising:

a multiplexer, wherein said multiplexer receives said digital feedback signal from said loop filter, wherein said multiplexer receives said initializing value from said memory, and wherein said DCO is coupled to said multiplexer;

wherein:
said multiplexer is operable to provide said initializing value to said DCO during said initialization of said carrier-recovery loop; and
said multiplexer is operable to provide said digital feedback signal to said DCO after said initialization of said carrier-recovery loop.

15. The carrier-recovery loop of claim 13, wherein said memory is coupled to said loop filter, and wherein said memory is operable to store a sample of said digital feedback signal as said initializing value.

16. The carrier-recovery loop of claim 15, wherein said memory stores said sample of said digital feedback signal as said initializing value after said carrier-recovery loop has acquired said phase lock.

17. The carrier-recovery loop of claim 15, wherein said carrier-recovery loop is used in a time-division duplexing communications unit, wherein said communications unit alternates between receiving data and transmitting data, and wherein said initialization of said carrier-recovery loop occurs prior to said receiving data.

18. The carrier-recovery loop of claim 15, wherein said carrier-recovery loop is used in a time-division multiple access communications unit, wherein said communications unit alternates between receiving data and transmitting data, and wherein said initialization of said carrier-recovery loop occurs prior to said receiving data.

19. The carrier-recovery loop of claim 15, further comprising:
a stable reference oscillator that generates a stable reference signal at a stable reference frequency; and
a front-end multiplexer with a first input and a second input, wherein:
said first input is coupled to said signal input;
said second input is coupled to said stable reference oscillator;
said phase detector is coupled to said front-end multiplexer;
said front-end multiplexer is operable to provide said received signal to said phase detector; and
said front-end multiplexer is operable to provide said stable reference signal to said phase detector;
wherein said memory is operable to store said initializing value when said carrier-recovery loop is locked to said stable reference signal so that said initializing value represents said stable reference frequency of said stable reference oscillator.

20. The carrier-recovery loop of claim 19, wherein:
said stable reference oscillator is adjustable to compensate for slow frequency drifts;
said received signal is generated by a remote transmitter at a remote transmitter frequency;
said memory is operable to store a first initializing value when said carrier-recovery loop has acquired said phase lock with said received signal; and
said memory is operable to store a second initializing value when said carrier-recovery loop has acquired said phase lock with said stable reference signal;
the carrier-recovery loop further comprising a trimming unit for said stable reference, wherein:
said trimming unit receives said first initializing value and said second initializing value from said memory;
said trimming unit calculates a difference using said first initializing value and said second initializing value, wherein said difference represents a frequency offset between said stable reference frequency and said remote transmitter frequency; and
said trimming unit adjusts said stable reference oscillator to nullify said frequency offset between said stable reference frequency and said remote transmitter frequency.

21. The carrier-recovery loop of claim 19, wherein:
said receiver is comprised in a local time-division duplexing (TDD) transceiver;
said received signal is generated by a remote transmitter in a remote TDD transceiver at a remote transmitter frequency;
said stable reference oscillator is adjustable to compensate for slow frequency drifts;
said memory is operable to store a first initializing value when said carrier-recovery loop has acquired said phase lock with said received signal; and
said memory is operable to store a second initializing value when said carrier-recovery loop has acquired said phase lock with said stable reference signal;
the carrier-recovery loop further comprising a trimming unit for said stable reference, wherein:
said trimming unit receives said first initializing value and said second initializing value from said memory;
said trimming unit calculates a local difference using said first initializing value and said second initializing value, wherein said difference represents a local frequency offset between said stable reference frequency and said remote transmitter frequency;
said trimming unit receives a remote difference from said remote TDD transceiver, wherein said remote difference represents a remote frequency offset between a stable reference frequency in said remote transceiver and a local transmitter frequency of said local TDD transceiver; and
said trimming unit adjusts said stable reference oscillator to match said local frequency offset with said remote frequency offset.

22. The carrier-recovery loop of claim 19, wherein:
said receiver is comprised in a local time-division duplexing (TDD) transceiver;
said received signal is generated by a remote transmitter in a remote TDD transceiver at a remote transmitter frequency;
said stable reference oscillator is adjustable to compensate for slow frequency drifts; and
said memory is operable to store a remote transmitter value when said carrier-recovery loop has acquired said phase lock with said received signal;
the carrier-recovery loop further comprising a trimming unit for said stable reference, wherein:
said trimming unit receives said remote transmitter value from said memory;
said local TDD transceiver receives a local transmitter value from said remote TDD transceiver and said local TDD transceiver provides said local transmitter value to said trimming unit; and said trimming unit adjusts said stable reference oscillator to match said local transmitter value with said remote transmitter value.

23. The carrier-recovery loop of claim 20, or of claim 21, or of claim 22, wherein said trimming unit adjusts said stable reference oscillator after time periods over which said stable reference oscillator has significant frequency drifts.

24. The carrier-recovery loop of claim 20, or of claim 21, or of claim 22, wherein said stable reference oscillator comprises a piezoelectric crystal coupled to a varactor diode, and wherein said trimming unit controls a bias on said varactor diode to adjust said stable reference oscillator.

* * * * *